US009017926B2

(12) United States Patent
Chiu

(10) Patent No.: US 9,017,926 B2
(45) Date of Patent: Apr. 28, 2015

(54) OVERLAY MARK AND METHOD OF FORMING THE SAME

(75) Inventor: Chui-Fu Chiu, Taoyuan County (TW)

(73) Assignee: Nanya Technology Corporation, Taoyuan (TW)

(*) Notice: Subject to any disclaimer, the term of this patent is extended or adjusted under 35 U.S.C. 154(b) by 127 days.

(21) Appl. No.: 13/603,427

(22) Filed: Sep. 5, 2012

(65) Prior Publication Data

US 2014/0065380 A1    Mar. 6, 2014

(51) Int. Cl.
G03F 9/00 (2006.01)
G03F 1/56 (2012.01)
G03F 7/00 (2006.01)
G03F 7/20 (2006.01)

(52) U.S. Cl.
CPC .......... *G03F 1/56* (2013.01); *Y10T 428/24802* (2015.01); *G03F 9/7073* (2013.01); *G03F 7/00* (2013.01); *G03F 7/70633* (2013.01); *G03F 7/70683* (2013.01)

(58) Field of Classification Search
CPC . G03F 7/70633; G03F 9/7073; H01L 23/544; H01L 2223/54426
USPC .......................... 428/195.1; 430/311; 257/797
See application file for complete search history.

(56) References Cited

U.S. PATENT DOCUMENTS

2007/0222088 A1* 9/2007 Smith et al. .................... 257/797

* cited by examiner

*Primary Examiner* — Brittany Raymond
(74) *Attorney, Agent, or Firm* — Jianq Chyun IP Office

(57) ABSTRACT

A method of forming an overlay mark is provided. A plurality of photoresist patterns are formed on a substrate. Each of the photoresist patterns includes a first strip and a plurality of second strips arranged in parallel. The first strip crosses the second strips to form a fence shape. Further, there is a space between two adjacent photoresist patterns, and the space is fence-shaped. A plurality of islands are formed in each of the spaces to form dot type strip patterns. The photoresist patterns are removed, and the dot type strip patterns serve as the overlay mark.

2 Claims, 4 Drawing Sheets

OVERLAY MARK AND METHOD OF FORMING THE SAME

BACKGROUND

1. Field of the Invention

The invention relates to an overlay mark and a method of forming the same.

2. Description of Related Art

To cope with the needs that electronic products are light, slim, short, and compact, sizes of electronic devices are reduced gradually. However, since the development speed of exposure apparatus is much slower than the speed at which the sizes are reduced according to market requirements, currently, a double patterning process is proposed. The double patterning process uses an existing apparatus to expose a photoresist pattern in a larger size and then forms a spacer with a smaller width on a sidewall of the photoresist pattern. After that, photoresist layers are removed. Since the width of the spacer may be adjusted to a required size according to actual needs through an etching process, the spacer left may serve as an etching mask to form a pattern in a required size.

Currently, an overlay mark is composed of four bar-shaped photoresist layers. Since the double patterning process removes the photoresist layers, only a circular spacer surrounding the four bar-shaped photoresist layers is left as an overlay mark. The circular spacer occupies a small area and is unable to provide sufficient contrast. Therefore, a signal of the circular spacer is very weak, and an alignment is not easy.

SUMMARY OF THE INVENTION

The invention provides an overlay mark which provides sufficient contrast and enhances a signal strength to facilitate an alignment.

The invention provides a method of forming an overlay mark, the method being suitable for an existing double patterning process.

The invention provides a method of forming an overlay mark, the method including forming a plurality of photoresist patterns on a substrate. Each of the photoresist patterns includes a first strip and a plurality of second strips arranged in parallel. The first strip crosses the second strips to form a fence shape. Further, there is a space between two adjacent photoresist patterns, and the space is fence-shaped. Then, a plurality of islands are formed in each of the spaces to form dot type strip patterns. Next, the photoresist patterns are removed, and the dot type strip patterns are left to serve as the overlay mark.

According to an embodiment of the invention, a method of forming the islands includes forming a spacer material layer on the substrate and then anisotropically etching the spacer material layer to form a plurality of spacers on a sidewall of the photoresist patterns in each of the spaces to serve as the islands. A width of each of the spacers is greater than or equal to ½ of a distance between two corresponding adjacent second strips.

According to an embodiment of the invention, there are a plurality of first gaps between the second strips and the first strip of each of the photoresist patterns, and each of the second strips of two adjacent photoresist patterns correspond to each other and has a second gap between each other. A method of forming the islands includes forming a spacer material layer on the substrate and then anisotropically etching the spacer material layer to form a plurality of first spacers on a sidewall of the photoresist patterns and in the first gaps and to form a plurality of second spacers on a sidewall of the photoresist patterns and in the second gaps. A width of each of the first spacers is greater than ½ of a width of each of the first gaps, so that the first spacers fill up a bottom of the first gaps. A width of each of the second spacers is greater than ½ of a width of each of the second gaps, so that the second spacers fill up a bottom of the second gaps.

According to an embodiment of the invention, materials of the islands include silicon nitride ($Si_3N_4$) or silicon oxide ($SiO_4$).

The invention further provides a method of forming an overlay mark, the method including forming a plurality of photoresist patterns on a substrate. There are a plurality of gaps in each of the photoresist patterns. A spacer material layer is formed on the substrate to cover the photoresist patterns and is filled into the gaps. Then, the spacer material layer is anisotropically etched to form a plurality of spacers on a sidewall of the photoresist patterns and in each of the gaps. The spacers compose a plurality of islands. A width of each of the spacers is greater than or equal to ½ of a width of a corresponding gap.

According to an embodiment of the invention, materials of the islands include silicon nitride ($Si_3N_4$) or silicon oxide ($SiO_4$).

The invention further provides a method of forming an overlay mark, the method including forming a plurality of photoresist patterns on a substrate. Two adjacent photoresist patterns have a plurality of corresponding parts, and there are a plurality of gaps among the corresponding parts. A spacer material layer is formed on the substrate to cover the photoresist patterns and is filled into the gaps. Then, the spacer material layer is anisotropically etched to form a plurality of spacers on a sidewall of the photoresist patterns and in each of the gaps. The spacers compose a plurality of islands. A width of each of the spacers is greater than or equal to ½ of a width of a corresponding gap.

According to an embodiment of the invention, materials of the islands include silicon nitride ($Si_3N_4$) or silicon oxide ($SiO_4$).

The invention further provides an overlay mark including a plurality of dot type strip patterns, and each of the dot type strip patterns includes at least three columns. Odd columns respectively have a plurality of first islands arranged in a first distance. Even columns respectively have a plurality of second islands arranged in a second distance, and the second islands and the first islands are staggered.

According to an embodiment of the invention, the first distance is equal to the second distance.

Based on the above, the overlay mark according to embodiments of the invention provides sufficient contrast and enhances the signal strength to facilitate the alignment.

The invention provides the method of forming the overlay mark, the method being suitable for the existing double patterning process.

In order to make the aforementioned features and advantages of the invention more comprehensible, embodiments accompanying figures are described in detail below.

BRIEF DESCRIPTION OF THE DRAWINGS

The accompanying drawings are included to provide further understanding and are incorporated in and constitute a part of this specification. The drawings illustrate exemplary embodiments and, together with the description, serve to explain the principles of the invention.

DESCRIPTION OF EMBODIMENTS

FIGS. 1A to 1D are top views illustrating a method of forming an overlay mark according to an embodiment of the invention. FIG. 2A is a cross-sectional view along line I-I in FIG. 1C. FIG. 2B is a cross-sectional view along line II-II in FIG. 1C.

Figure 1A:
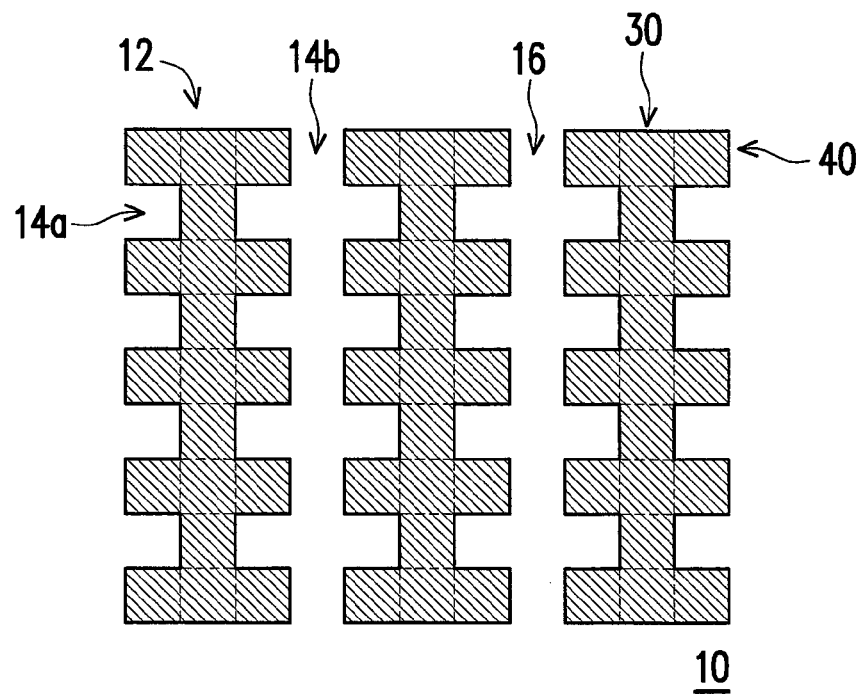
FIGS. 1A to 1D are top views illustrating a method of forming an overlay mark according to an embodiment of the invention.
Figure 2A:
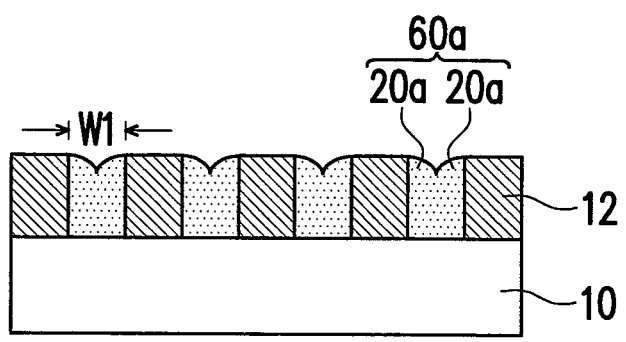
FIG. 2A is a cross-sectional view along line I-I in FIG. 1C.
Figure 2B:
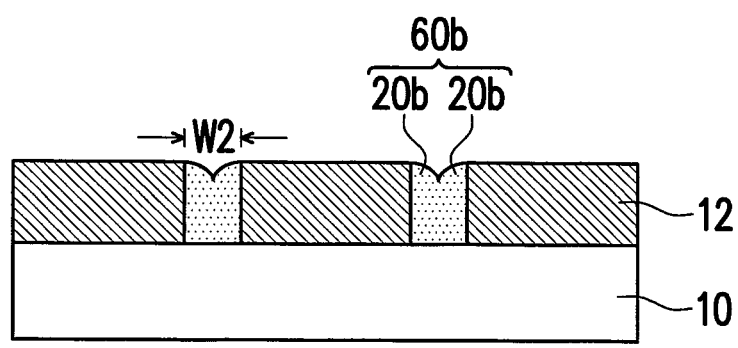
FIG. 2B is a cross-sectional view along line II-II in FIG. 1C.

Referring to FIG. 1A, in a method of forming an overlay mark of the invention, a plurality of photoresist patterns 12 are formed on a substrate 10. There are a plurality of first gaps 14a in each of the photoresist patterns 12. In an embodiment, each of the photoresist patterns 12 includes a first strip 30 and a plurality of second strips 40. The second strips 40 are arranged in parallel in a column, and the first strip 30 crosses the second strips 40 to form a fence shape. There are the plurality of first gaps 14a between the second strips 40 and the first strip 30. Each of the second strips 40 of two adjacent photoresist patterns 12 correspond to each other and has a second gap 14b between each other, so that a space 16 between the two adjacent photoresist patterns 12 is also fence-shaped.

Figure 1B:
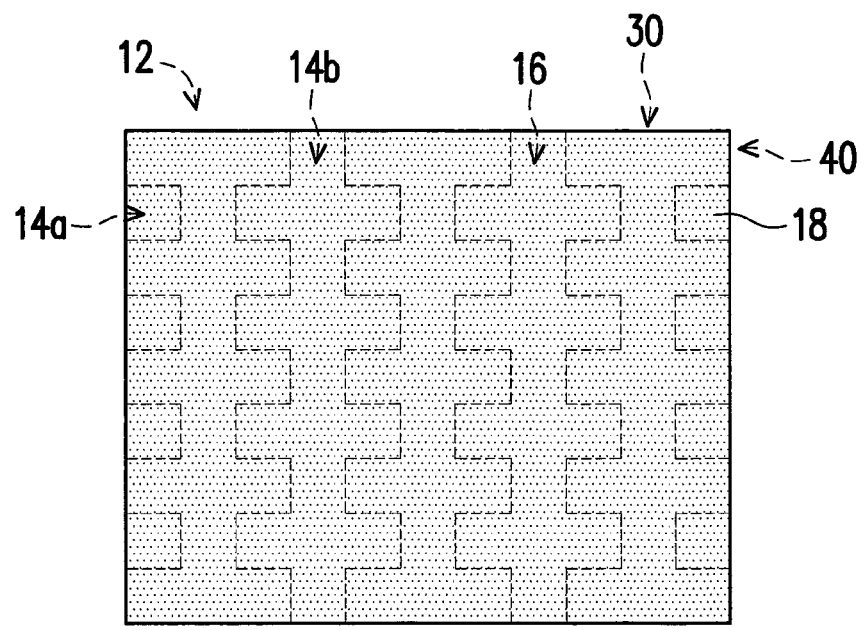

Then, referring to FIG. 1B, a spacer material layer 18 is formed on the substrate 10 to cover the photoresist patterns 12 and is filled into the spaces 16, i.e. into the first gaps 14a and the second gaps 14b. A material of the spacer material layer 18 is, for example, silicon nitride ($Si_3N_4$) or silicon oxide ($SiO_4$). A method of forming the spacer material layer 18 is, for example, a spin coating process, a low-temperature chemical vapor deposition (LTD) process.

Figure 1C:
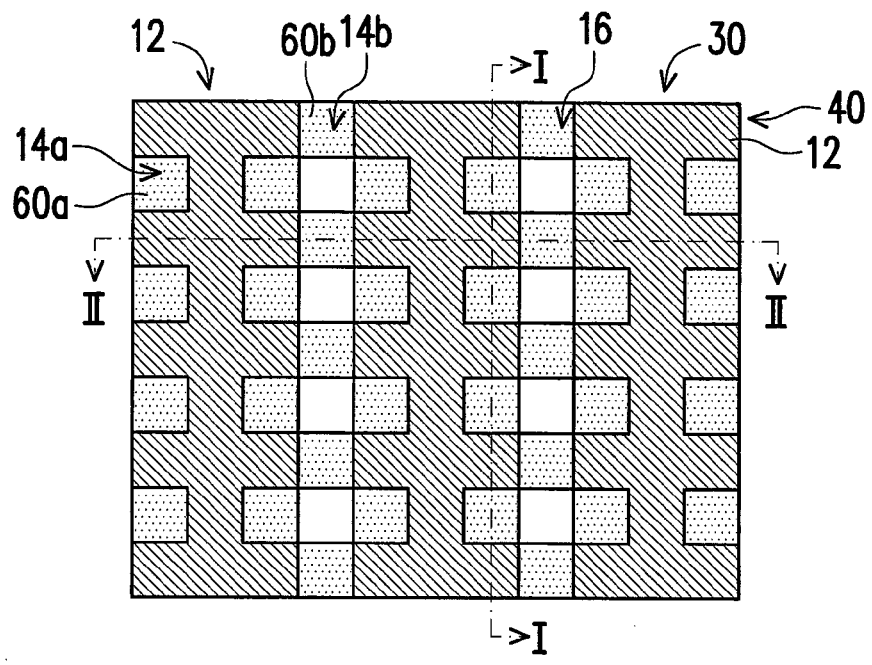

Thereafter, referring to FIGS. 1C, 2A and 2B, the spacer material layer 18 is anisotropically etched to form a plurality of first spacers 20a and second spacers 20b on sidewalls of the photoresist patterns 12 in the first gaps 14a and the second gaps 14b of each of the spaces 16. A width of the first spacers 20a is greater than or equal to ½ of a width W1 (a distance between two adjacent second strips 40 in the same photoresist pattern 12) of a corresponding first gap 14a, so that the first spacers 20a fill up a bottom of the first gaps 14a and form a plurality of first islands 60a. A width of the second spacers 20b is greater than or equal to ½ of a width W2 (a distance between two adjacent second strips 40 of two adjacent photoresist patterns 12) of a corresponding second gap 14b, so that the second spacers 20b fill up a bottom of the second gaps 14b and form a plurality of second islands 60b. A method of anisotropically etching the spacer material layer 18 is, for example, a dry etching process.

Figure 1D:
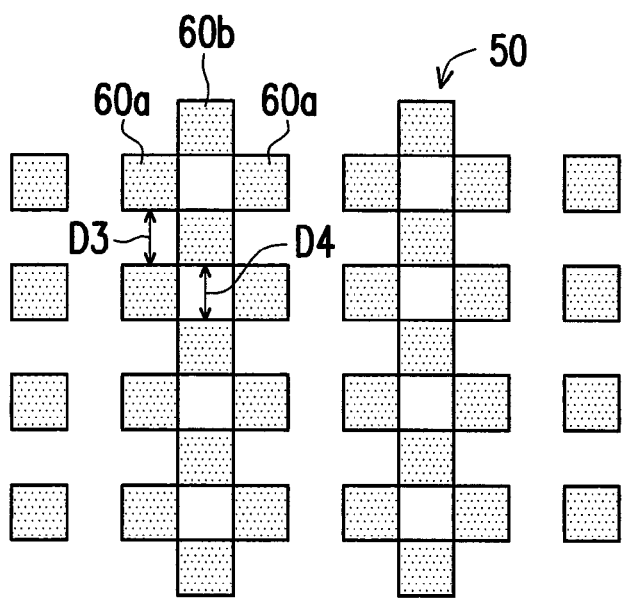

Thereafter, referring to FIG. 1D, the photoresist patterns 12 are removed, and the first islands 60a left and the second islands 60b left form a plurality of dot type strip patterns 50 to serve as an overlay mark.

The first strip 30 and the second strips 40 are illustrated with strip-shaped rectangles; therefore, the formed first islands 60a and the formed second islands 60b are also shaped as rectangles. However, in the invention, shapes of the first islands 60a and the second islands 60b composing the overlay mark are not limited to rectangles. By changing a shape of a gap of the photoresist patterns 12, the first islands 60a and the second islands 60b may have regular or irregular shapes. The regular shapes are, for example, circles, squares, rectangles or other polygons.

Figure 3:
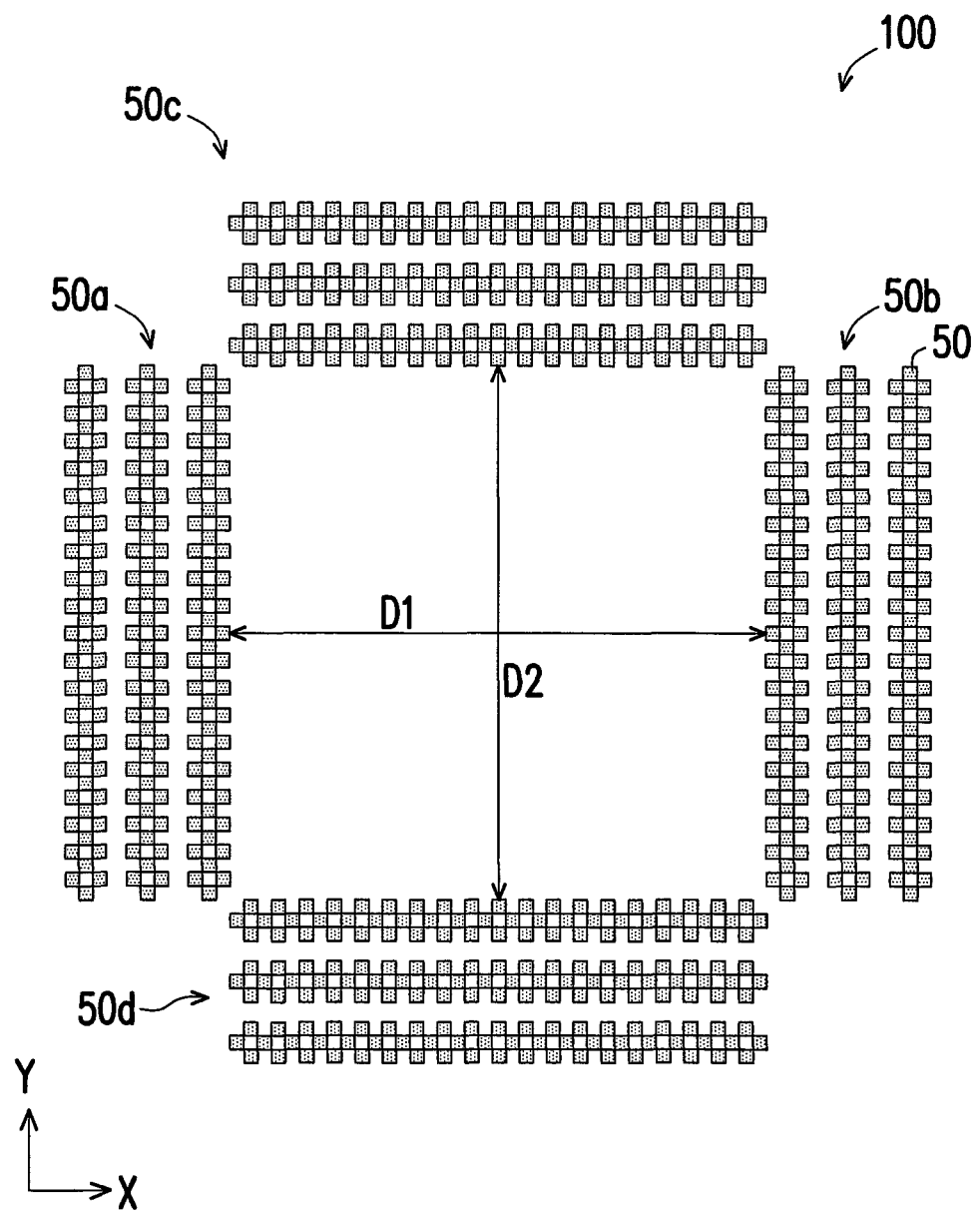
FIG. 3 is a top view illustrating an overlay mark according to embodiments of the invention.

FIG. 3 is a top view illustrating an overlay mark according to an embodiment of the invention.

Referring to FIG. 3, an overlay mark 100 of the invention includes a plurality of dot type strip patterns 50. In an embodiment, the overlay mark 100 includes four sets of dot type strip patterns 50a, 50b, 50c and 50d. A first set of dot type strip patterns 50a and a second set of dot type strip patterns 50b extend in a first direction Y and have a distance D1 between each other. A third set of dot type strip patterns 50c and a fourth set of dot type strip patterns 50d extend in a second direction X and have a distance D2 between each other. The first set of the dot type strip patterns 50a, the second set of the dot type strip patterns 50b, the third set of the dot type strip patterns 50c and the fourth set of the dot type strip patterns 50d are arranged as rectangles.

In an embodiment, each of the dot type strip patterns 50 in each of the sets of the dot type strip patterns 50a, 50b, 50c and 50d in FIG. 3 includes three columns (as shown in FIG. 1D). Referring to FIG. 1D, odd columns respectively have a plurality of first islands 60a arranged in a first distance D3. Even columns respectively have a plurality of second islands 60b arranged in a second distance D4, and the second islands 60b and the first islands 60a are staggered. In an embodiment, the first distance D3 is equal to the second distance D4. The first islands 60a and the second islands 60b may have regular or irregular shapes. The regular shapes are, for example, circles, squares, rectangles or other polygons.

The overlay mark of the invention is composed of the plurality of sets of the dot type strip patterns, and the islands of each of the dot type strip patterns have relatively large bottoms, so that the overlay mark provides sufficient contrast and enhances the signal strength. Therefore, the alignment is very easy. In addition, the dot type strip patterns of the overlay mark of the invention are formed by forming the spacers on the sidewalls of the photoresist patterns; therefore, the process of fabricating the overlay mark is very suitable for the existing double patterning process.

Although the invention has been disclosed by the above embodiments, they are not intended to limit the invention. It will be apparent to those of ordinary skill in the art that modifications and variations to the invention may be made without departing from the spirit and the scope of the invention. Accordingly, the protection scope of the invention falls in the appended claims.

What is claimed is:

1. An overlay mark, comprising:
a plurality of dot type strip patterns, each of the dot type strip patterns comprising at least three columns, wherein odd columns respectively have a plurality of first islands arranged in a first distance D3;
even columns respectively have a plurality of second islands arranged in a second distance D4, wherein the adjacent first and second islands are staggered and are connected with each other at the corners.

2. The overlay mark according to claim 1, wherein the first distance D3 is equal to the second distance D4.

* * * * *